(12) United States Patent
Huang

(10) Patent No.: US 9,887,358 B2
(45) Date of Patent: Feb. 6, 2018

(54) ORGANIC THIN FILM TRANSISTOR HAVING ALIGNED SURFACES AND METHOD FOR PREPARING THE SAME, ARRAY SUBSTRATE AND DISPLAY DEVICE

(71) Applicant: BOE TECHNOLOGY GROUP CO., LTD., Beijing (CN)

(72) Inventor: Wei Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 160 days.

(21) Appl. No.: 14/770,302

(22) PCT Filed: Jan. 12, 2015

(86) PCT No.: PCT/CN2015/070499
§ 371 (c)(1),
(2) Date: Aug. 25, 2015

(87) PCT Pub. No.: WO2016/045255
PCT Pub. Date: Mar. 31, 2016

(65) Prior Publication Data
US 2016/0380200 A1    Dec. 29, 2016

(30) Foreign Application Priority Data
Sep. 26, 2014  (CN) .......................... 2014 1 0505119

(51) Int. Cl.
*H01L 29/08* (2006.01)
*H01L 51/00* (2006.01)
(Continued)

(52) U.S. Cl.
CPC ........ *H01L 51/0012* (2013.01); *C09K 19/582* (2013.01); *H01L 27/3274* (2013.01);
(Continued)

(58) Field of Classification Search
CPC ............. H01L 51/0012; H01L 51/0006; H01L 51/0076; H01L 51/05; H01L 51/052;
(Continued)

(56) References Cited

U.S. PATENT DOCUMENTS

2006/0208266 A1  9/2006 Yamamoto
2010/0244000 A1* 9/2010 Tanaka ................ H01L 51/0074
                                                257/40
(Continued)

FOREIGN PATENT DOCUMENTS

CN         1588668 A      3/2005
CN         1684286 A     10/2005
(Continued)

OTHER PUBLICATIONS

First Office Action regarding Chinese application No. 201410505119.4, dated Jul. 26, 2016. Translation provided by Dragon Intellectual Property Law Firm.
(Continued)

*Primary Examiner* — Matthew Gordon
(74) *Attorney, Agent, or Firm* — Harness, Dickey & Pierce, P.L.C.

(57) ABSTRACT

Disclosed are an organic thin film transistor and a method for preparing the same, an array substrate and a display device. An organic semiconductor layer of the organic thin film transistor is formed on an anisotropic insulating layer, this guarantees that the organic semiconductor layer has a crystallization direction with a high degree of order and the organic semiconductor layer has a specific alignment, thus carrier mobility can be improved, so that the performance of the organic thin film transistor can be upgraded. Moreover, the process of preparing the insulating layer has advantages of simple process, large area and low cost, etc., and the thickness of the anisotropic insulating layer manufactured is (Continued)

small; since there exists no mechanical friction, there exists no badness caused by particles generated by friction.

14 Claims, 6 Drawing Sheets

(51) Int. Cl.
  *H01L 27/32* (2006.01)
  *H01L 51/05* (2006.01)
  *H01L 51/10* (2006.01)
  *C09K 19/58* (2006.01)

(52) U.S. Cl.
  CPC ...... *H01L 51/0006* (2013.01); *H01L 51/0076* (2013.01); *H01L 51/052* (2013.01); *H01L 51/0529* (2013.01); *H01L 51/0545* (2013.01); *H01L 51/0566* (2013.01); *H01L 51/105* (2013.01); *C09K 2219/03* (2013.01)

(58) Field of Classification Search
  CPC ............. H01L 51/0529; H01L 51/0545; H01L 51/0566; H01L 51/105; H01L 27/3274; C09K 19/582
  See application file for complete search history.

(56) References Cited

U.S. PATENT DOCUMENTS

| | | |
|---|---|---|
| 2012/0075568 A1 | 3/2012 | Chang et al. |
| 2015/0060800 A1 | 3/2015 | Qiu et al. |

FOREIGN PATENT DOCUMENTS

| | | |
|---|---|---|
| CN | 1751111 A | 3/2006 |
| CN | 1881647 A | 12/2006 |
| CN | 101106179 A | 1/2008 |
| CN | 101425563 A | 5/2009 |
| CN | 103151461 A | 6/2013 |
| CN | 103913891 A | 7/2014 |
| JP | 2011184541 A | 9/2011 |

OTHER PUBLICATIONS

Written Opinion of the International Searching Authority for international application No. PCT/CN2015/070499.

First Office Action regarding Chinese Application No. 201410505698.2, dated Aug. 23, 2016. Translation provided by Dragon Intellectual Property Law Firm.

Written Opinion of the International Searching Authority and International Search Report regarding International Application No. PCT/CN2015/070650, dated Jul. 2, 2015. Translation provided by Dragon Intellectual Property Law Firm.

Non-final Office Action regarding U.S. Appl. No. 14/769,340, dated Feb. 27, 2017.

Non-final Office Action regarding U.S. Appl. No. 14/769,340, dated Oct. 7, 2016.

\* cited by examiner

ORGANIC THIN FILM TRANSISTOR HAVING ALIGNED SURFACES AND METHOD FOR PREPARING THE SAME, ARRAY SUBSTRATE AND DISPLAY DEVICE

CROSS REFERENCE TO RELATED APPLICATION

The present application is the U.S. national phase of PCT Application No. PCT/CN2015/070499 filed on Jan. 12, 2015, which claims a priority of the Chinese application No.201410505119.4 filed in China on Sep. 26, 2014, the entire content of which is incorporated by reference.

FIELD OF THE INVENTION

The present invention relates to the field of thin film preparation technologies, and in particular, to an organic thin film transistor and a method for preparing the same, an array substrate and a display device.

DESCRIPTION OF THE PRIOR ART

An Organic Thin Film Transistor (OTFT, for short) employs an organic semiconductor as an active layer and includes: a substrate, a gate electrode, a gate insulating layer, an organic semiconductor layer, a source electrode and a drain electrode. Generally, OTFT may be divided into four structures: bottom gate-bottom contact, bottom gate-top contact, top gate-bottom contact and top gate-top contact. Bottom gate structure refers to one where the gate electrode is located under the organic semiconductor layer, top gate structure refers to one where the gate electrode is located above the organic semiconductor, bottom contact structure refers to one where the organic semiconductor layer is located above the source electrode and the drain electrode, and top contact structure refers to one where the organic semiconductor layer is located under the source electrode and the drain electrode. For example, for the bottom gate-top contact structure as shown in FIG. 1, a gate insulating layer is formed between a gate electrode and an organic semiconductor layer, while a source electrode and a drain electrode are totally deposited on the organic semiconductor layer; for the bottom gate-bottom contact structure as shown in FIG. 2, a gate insulating layer is formed between a gate electrode and a source electrode as well as a drain electrode, and an organic semiconductor layer is deposited on a source electrode and a drain electrode and a gate insulating layer.

When an OTFT is formed of the same material, OTFT with a bottom contact structure has a smaller ohmic contact resistance and a higher field effect mobility than OTFT with a top contact structure OTFT, thus a common OTFT device is OTFT with a bottom contact structure. Compared with an OTFT with a top contact structure, it is easier for an OTFT with a bottom contact structure to manufacture a high-resolution display device, thus an OTFT with a bottom contact structure is often employed in a high-resolution OTFT display device. Additionally, an OTFT with a bottom contact structure is similar to the a-Si TFT that is produced in batch production at present, and it has a high reutilization of the production facility, thus it has become a structure concentrated on developing in the OTFT research and application field.

There are many factors that affect the performance of an OTFT device, and the interfacial characteristic formed between the gate insulating layer and the organic semiconductor layer is one of the main factors that affect the performance of an OTFT device.

SUMMARY OF THE INVENTION

The present invention provides an organic thin film transistor and a method for preparing the same, an array substrate and a display device which can eliminate the influence of bad interfacial characteristics, which is formed between the insulating layer and the organic semiconductor layer, on the performance of an organic thin film transistor when the organic semiconductor layer is formed on the insulating layer.

In order to solve the above technical problem, the invention provides a method for preparing an organic thin film transistor, which includes: forming an insulating layer; and forming a pattern of an organic semiconductor layer on the insulating layer, wherein the step of forming an insulating layer includes:

forming a first thin film, which comprises an ion liquid thin film formed of an ion liquid and a polymerizable material thin film formed of a liquid polymerizable material, wherein the polymerizable material thin film is located under the ion liquid thin film;

separating positive and negative ions in the ion liquid thin film, and aligning a surface of the polymerizable material thin film;

keeping separation of the positive and the negative ions, and polymerizing the polymerizable material thin film to form a second thin film with an aligned surface;

removing the ion liquid thin film; and forming a liquid crystal molecule thin film consisting of liquid crystal molecules on the second thin film, and polymerizing the liquid crystal molecule thin film to form an organic thin film, wherein an interface where the organic thin film contacts the second thin film is aligned in such a manner as to match the aligned surface of the second thin film, so as to form an anisotropic organic thin film.

According to an embodiment of the preparation method, the organic semiconductor layer and the organic thin film have an identical alignment direction.

According to an embodiment of the preparation method, the alignment direction is parallel to an extension direction of a connection line between a source electrode and a drain electrode.

According to an embodiment of the preparation method, the ion liquid comprises a side-chain radical, and an acting force between the side-chain radical and an air interface is larger than an acting force between the polymerizable material and an air interface.

According to an embodiment of the preparation method, the step of forming the first thin film includes:

preparing a homogeneous-phase mixed solution that includes an ion liquid and a liquid polymerizable material; and forming a thin film consisting of the mixed solution under an air environment, wherein the ion liquid is located above the polymerizable material under the action of the side-chain radical.

According to an embodiment of the preparation method, the side-chain radical is a fluorated radical.

According to an embodiment of the preparation method, the ion liquid is a liquid crystal phase ion liquid.

According to an embodiment of the preparation method, positive and negative ions in the ion liquid thin film are separated by applying an electric field.

According to an embodiment of the preparation method, the polymerizable material is a photopolymerizable material.

According to an embodiment of the preparation method, the preparation method further includes:

forming a gate electrode of the organic thin film transistor before forming the insulating layer;

forming a source electrode and a drain electrode on the insulating layer before forming a pattern of an organic semiconductor layer on the insulating layer; and forming a pattern of an organic semiconductor layer on the insulating layer, the source electrode and the drain electrode.

According to another aspect of the invention, the invention further provides an organic thin film transistor, which includes an insulating layer and a pattern of an organic semiconductor layer that is located on the insulating layer, wherein the insulating layer includes:

a second thin film with an aligned surface; and an organic thin film located on the second thin film, wherein the interface where the organic thin film contacts the second thin film is aligned in such a manner as to match the aligned surface of the second thin film, so as to form an anisotropic organic thin film, wherein the organic thin film is a liquid crystal macromolecule thin film.

According to an embodiment of the organic thin film transistor of the invention, the organic semiconductor layer and the organic thin film have an identical alignment direction.

According to an embodiment of the organic thin film transistor of the invention, the alignment direction is parallel to an extension direction of a connection line between a source electrode and a drain electrode.

According to an embodiment of the organic thin film transistor of the invention, the organic thin film transistor further includes:

a gate electrode, wherein the insulating layer is located on the gate electrode; and a source electrode and a drain electrode that are located on the insulating layer;

wherein the pattern of the organic semiconductor layer is located on the insulating layer, the source electrode and the drain electrode.

According to a further aspect of the invention, there provides an array substrate, which includes the organic thin film transistor as described above.

According to a further aspect of the invention, there provides a display device, which includes an array substrate as described above.

The above technical solutions of the invention have the following advantageous effects:

In each of the above technical solutions, an organic semiconductor layer of an organic thin film transistor is formed on an anisotropic insulating layer so as to guarantee that the organic semiconductor layer has a crystallization direction with a high degree of order and the organic semiconductor layer has a specific alignment direction, thus carrier mobility can be improved, and the performance of the organic thin film transistor can be upgraded. Additionally, the method for preparing the insulating layer according to the invention has the advantages of simple process, large area and low cost, etc., and the thickness of the anisotropic insulating layer manufactured is small. Since there exists no mechanical friction, there exists no badness caused by particles generated by friction.

BRIEF DESCRIPTION OF THE DRAWINGS

In order to more clearly illustrate the technical solutions of the embodiments of the invention or the prior art, the drawings required in the description of the embodiments or the prior art will be briefly introduced below. Apparently, the drawings in the description below only show some embodiments of the invention, and other drawings may also be obtained by one of ordinary skills in the art based on these drawings without creative work.

DETAILED DESCRIPTION OF THE PREFERRED EMBODIMENTS

Figure 1:
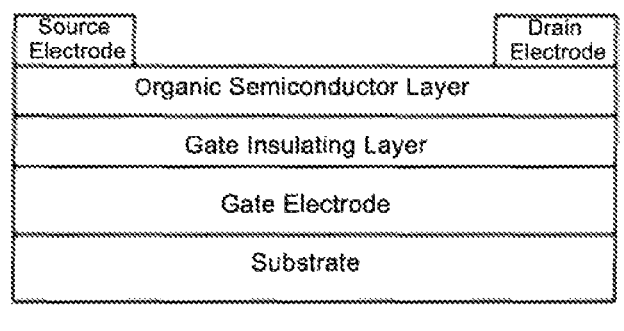
FIG. 1 shows a structural representation of an existing bottom gate-top contact OTFT.
Figure 2:
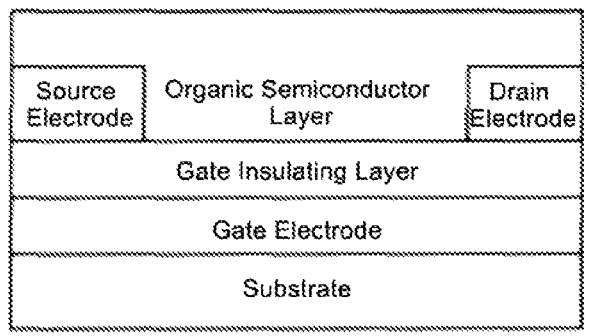
FIG. 2 shows a structural representation of an existing bottom gate-bottom contact OTFT.

The invention provides a method for preparing an organic thin film transistor, the anisotropic insulating layer prepared has a fixed alignment direction and a small thickness, and there exists no badness caused by particles generated by friction. Thus, when a pattern of an organic semiconductor layer is formed on the insulating layer, it may guarantee that the organic semiconductor layer has a crystallization direction with a high degree of order and the organic semiconductor layer has a specific alignment direction, thus carrier mobility can be improved, so that the performance of the organic thin film transistor can be upgraded.

In the preparation method, by utilizing the feature that liquid crystal molecules (organic compound) can be aligned in a certain direction, an anisotropic insulating layer may be prepared by liquid crystal molecules. The step of forming an insulating layer includes: forming an ion liquid thin film on the surface of a liquid polymerizable material thin film; aligning the surface of the polymerizable material thin film by separating positive and negative ions in the ion liquid thin film; keeping separation of the positive and the negative ions, and polymerizing the polymerizable material thin film, thereby forming a second thin film with an aligned surface so as to fix the alignment direction; then removing the ion liquid thin film; forming a liquid crystal molecule thin film on the second thin film, and polymerizing the liquid crystal molecule thin film to form an organic thin film, wherein an interface where the organic thin film contacts the second thin film is aligned in such a manner as to match the aligned surface of the second thin film, so as to form an anisotropic organic thin film, and then constituting the desirable anisotropic insulating layer by the second thin film and the organic thin film. The above steps have the advantages of simple process, large area and low cost, etc., the thickness of the anisotropic insulating layer manufactured is small, and since there exists no mechanical friction, there exists no badness caused by particles generated by friction.

It should be noted that, the anisotropy in the invention refers to a phenomenon that a physical property changes with direction.

Before describing the technical solutions of the invention in detail, the technical terms concerned in the invention will be explained first.

Ion Liquid: It is consist of ions carrying positive charges (positive ions) and ions carrying negative charges (negative ions), it has a good dissolubility in both an organic substance and an inorganic substance, and it has good thermal stability and chemical stability, it may be easily separated from other substances, and it may be recycled. In 1996, Bonhote P. and Dias A. systematically synthesize a series of ion liquids by a method of fixing anions, that is, changing the different substituents on an imidazole molecule.

Liquid Crystal: It is a phase state. Liquid crystal phase can only be generated by combining molecules with particular forms, it may flow and have the optical properties of crystals, and moreover, it is sensitive to an electromagnetic field. The constructional matter of liquid crystal is an organic compound, that is, a compound consisted by carbon as the center.

The specific implementation modes of the invention will be further described in detail below in conjunction with the drawings and embodiments. The following embodiments are used for illustrate the invention, rather than limiting the scope of the invention.

Figure 3:
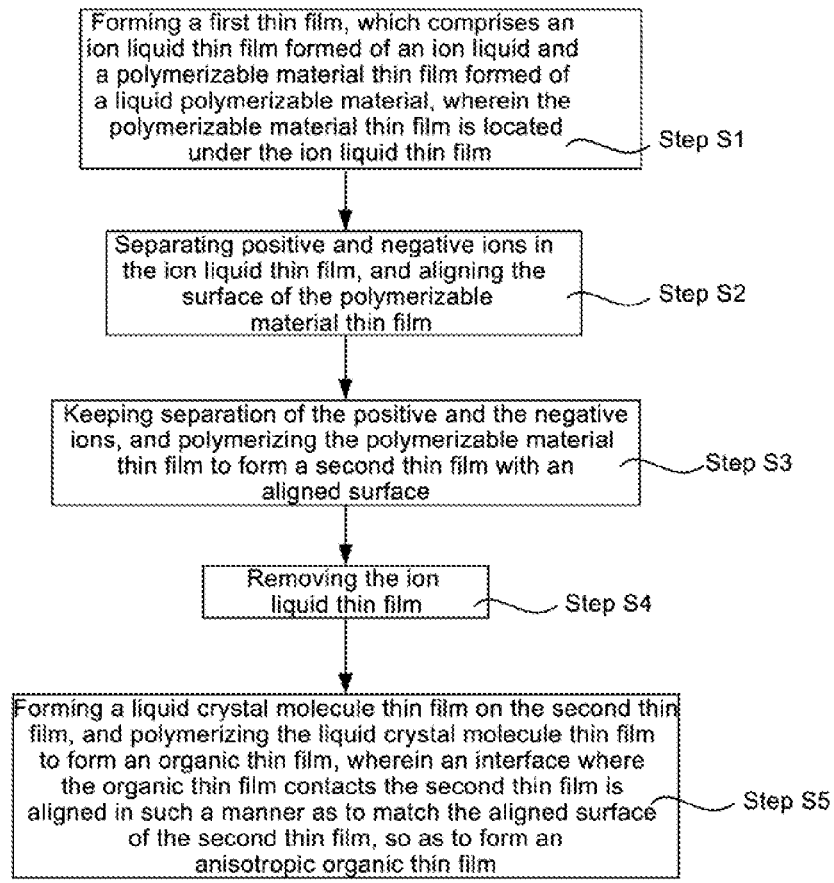
FIG. 3 shows a flow chart of a method for preparing an anisotropic organic thin film according to one embodiment of the invention.

According to one aspect of the invention, there provides a method for preparing an organic thin film transistor, which includes: forming an insulating layer; and forming a pattern of an organic semiconductor layer on the insulating layer; wherein, as shown in FIG. 3, the step of forming the insulating layer includes:

Step S1: forming a first thin film, which comprises an ion liquid thin film formed of an ion liquid and a polymerizable material thin film formed of a liquid polymerizable material, wherein the polymerizable material thin film is located under the ion liquid thin film;

Step S2: separating positive and the negative ions in the ion liquid thin film, and aligning the surface of the polymerizable material thin film;

Step S3: keeping separation of the positive and the negative ions, and polymerizing the polymerizable material thin film to form a second thin film with an aligned surface;

Step S4: removing the ion liquid thin film;

Step S5: forming a liquid crystal molecule thin film on the second thin film, and polymerizing the liquid crystal molecule thin film to form an organic thin film, wherein an interface where the organic thin film contacts the second thin film is aligned in such a manner to match the aligned surface of the second thin film, so as to form an anisotropic organic thin film.

According to an embodiment of the invention, the organic semiconductor layer and the organic thin film have an identical alignment direction.

In the working state of an OTFT, carriers are transmitted from a source electrode to a drain electrode or from a drain electrode to a source electrode. According to an embodiment of the invention, the alignment direction of the organic semiconductor layer is provided parallel to an extension direction of a connection line between a source electrode and a drain electrode so as to upgrade the electrical features of the OTFT. It should be noted that, the "parallel" in the invention is not absolute parallelism, so long as the two are approximately parallel. That is, the alignment direction of the organic semiconductor layer and the extension direction of the connection line between a source electrode and a drain electrode may be fluctuate in a certain angle scope, for example, the fluctuation angle scope may be ±5°, which also pertains to the protection scope of the invention.

The insulating layer formed by the above steps has a fixed alignment direction, and it may guarantee that an organic semiconductor layer formed thereon has a crystallization direction with a high degree of order and the organic semiconductor layer has a specific alignment direction, thus carrier mobility can be improved, thereby the performance of the organic thin film transistor can be upgraded.

Figure 4:
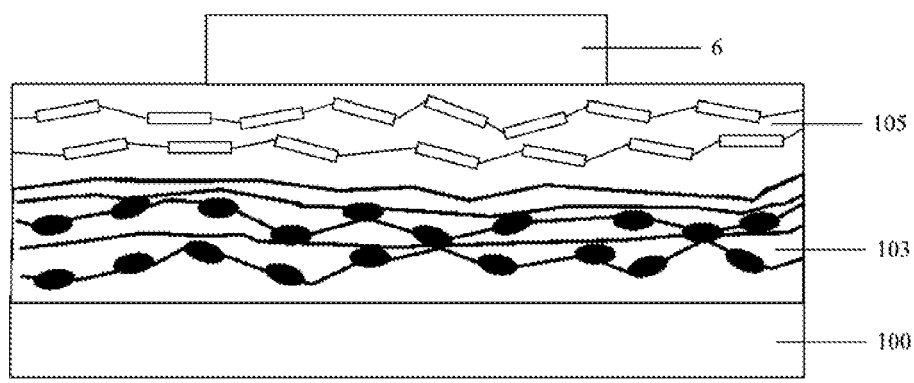
FIG. 4 shows a structural representation of an anisotropic organic thin film according to one embodiment of the invention.

Correspondingly, the organic thin film transistor formed by the above steps includes the anisotropic insulating layer formed and a pattern of an organic semiconductor layer 6 that is located on the insulating layer, as shown in FIG. 4. The insulating layer includes a second thin film 103 and an organic thin film 105 that is located on the second thin film 103, and the organic thin film 105 is a liquid crystal macromolecule thin film. The second thin film 103 is a macromolecule thin film, and the surface thereof has such an alignment direction that the liquid crystal molecules formed thereon are also aligned, so that the contact interface between the organic thin film 105 formed by polymerizing the liquid crystal molecules and the second thin film 103 has an alignment direction that matches the surface of the second thin film 103, thus an anisotropic organic thin film 105 is formed. That is, the organic thin film 105 has a fixed alignment direction. The anisotropic insulating layer consists of the second thin film 103 and the organic thin film 105.

For a bottom gate-bottom contact OTFT, the anisotropic insulating layer is specifically a gate insulating layer.

A method for preparing an organic thin film transistor according to one embodiment of the invention will be introduced in detail below by taking a bottom gate-bottom contact OTFT as an example.

Figure 5:
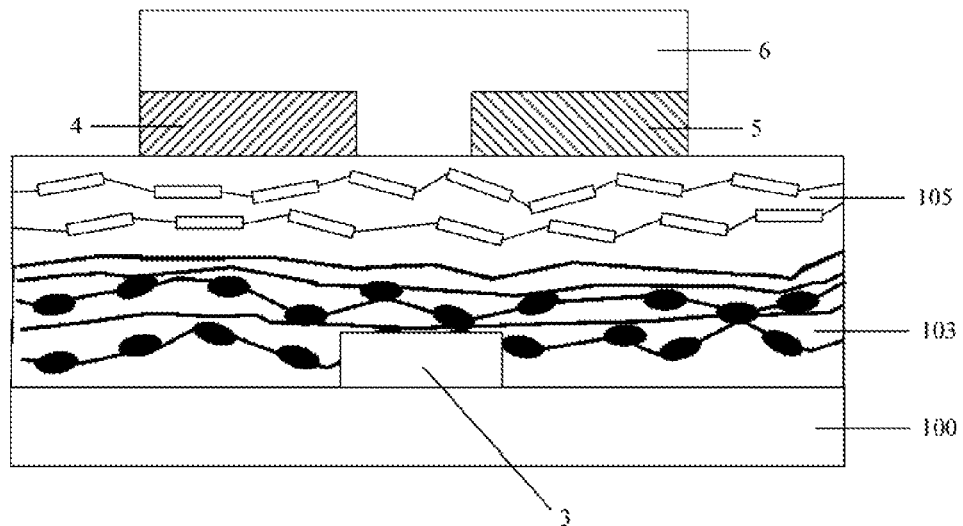
FIG. 5 shows a structural representation of an organic thin film transistor according to one embodiment of the invention.

As shown in FIG. 5, a method for preparing a bottom gate-bottom contact OTFT includes:

forming a gate electrode 3 on a backing substrate 100;

forming a gate insulating layer on the gate electrode 3;

forming a source electrode 4 and a drain electrode 5 on the gate insulating layer; and forming a pattern of an organic semiconductor layer 6 on the gate insulating layer, the source electrode 4 and the drain electrode 5.

The step of forming a gate insulating layer on the gate electrode 3 includes:

Step a: forming a first thin film, which includes an ion liquid thin film formed of an ion liquid and a polymerizable material thin film formed of a liquid polymerizable material, on the gate electrode, wherein the polymerizable material thin film is located between the gate electrode and the ion liquid thin film;

The polymerizable material may be a photopolymerizable material, for example, a photosensitive resin or a photosensitive monomer;

Step b: separating positive and negative ions in the ion liquid thin film, and aligning the surface of the polymerizable material thin film;

Step c: keeping separation of the positive and the negative ions, and polymerizing the polymerizable material thin film to form a second thin film with an aligned surface;

The second thin film may be a macromolecule thin film;

Step d: removing the ion liquid thin film;

Step e: forming a liquid crystal molecule thin film on the second thin film, and polymerizing the liquid crystal molecule thin film to form an organic thin film, wherein an interface where the organic thin film contacts the second thin film is aligned in such a manner as to match the aligned surface of the second thin film, so as to form an anisotropic organic thin film, which may be a liquid crystal macromolecule thin film.

The gate insulating layer prepared by the above steps has a specific alignment direction and a small thickness, and since there exists no mechanical friction, there exists no badness caused by particles generated by friction. Additionally, the preparation process has the advantage of simple process, the preparation of large anisotropic gate insulating layer and low cost, etc. When an organic semiconductor layer is formed on the gate insulating layer, it may guarantee that the organic semiconductor layer has a crystallization direction with a high degree of order and the organic semiconductor layer has a specific alignment direction, thus carrier mobility can be improved, thereby the performance of the OTFT can be upgraded.

As shown in FIG. 5, the bottom gate-bottom contact OTFT manufactured by the preparation method according to one embodiment of the invention includes a gate electrode 3, an anisotropic gate insulating layer, a source electrode 4, a drain electrode 5 and a pattern of an organic semiconductor layer 6 that are formed in turn on a backing substrate 100. The gate insulating layer includes a second thin film 103 that is located on the gate electrode 3 and an organic thin film 105 that is located on the second thin film 103. The organic thin film 105 is a liquid crystal macromolecule thin film. The second thin film 103 is a macromolecule thin film, and the surface thereof has such an alignment direction that the liquid crystal molecules formed thereon are also aligned, so that the contact interface between the organic thin film 105 formed by polymerizing the liquid crystal molecules and the second thin film 103 has an alignment direction that matches the surface of the second thin film 103, thus an anisotropic organic thin film 105 is formed, that is, the organic thin film 105 has a high degree of order. The anisotropic gate insulating layer consists of a second thin film 103 and an organic thin film 105. The organic semiconductor layer 6 formed on the gate insulating layer and the organic thin film 105 have an identical alignment direction, wherein, the alignment direction is parallel to the extension direction of the connection line between the source electrode 4 and the drain electrode 5. In the working state of an OTFT, the carriers are transmitted from the source electrode 4 to the drain electrode 5 or from the drain electrode 5 to the source electrode 4, and the alignment direction of the organic semiconductor layer 6 may improve the mobility of the carriers, so that the electrical features of the OTFT may be upgraded.

Because a high-resolution display device may be more easily manufactured by a bottom gate-bottom contact OTFT, the bottom gate-bottom contact OTFT is generally used for a high-resolution OTFT display device.

According to an embodiment of the invention, the ion liquid for preparing the first thin film of the anisotropic insulating layer includes a side-chain radical, for example, a fluorated radical, and an acting force between the side-chain radical and an air interface is larger than an acting force between the polymerizable material and an air interface.

According to an embodiment of the invention, the step of forming the first thin film includes:
preparing a homogeneous-phase mixed solution comprising the ion liquid and the polymerizable material; and
forming a thin film consisting of the mixed solution under an air environment, wherein the ion liquid is located above the polymerizable material under the action of the side-chain radical.

For the purpose for being in favor of forming a film of the mixed solution, a film-forming agent may also be added to the mixed solution.

In the above step of forming the first thin film, the first thin film required is directly formed via a one-time film forming process. That is, the polymerizable material thin film of the first thin film is located under the ion liquid thin film, thus the manufacture process of the first thin film is simplified.

However, a polymerizable material thin film may be first formed via a film forming process such as spin coating, printing and transfer printing, etc., and then an ion liquid thin film may be formed on the polymerizable material thin film via a film-forming process such as spin coating, printing and transfer printing, etc., thereby forming the first thin film required.

After forming the first thin film, the surface of the polymerizable material thin film is aligned by separating positive and negative ions in the ion liquid thin film. In an example of the invention, the ion liquid may be a liquid crystal phase ion liquid. Since liquid crystals are sensitive to an electromagnetic field, the positive and the negative ions in the ion liquid thin film may be separated by applying an electric field, thus it is easy to achieve the separation of the positive and the negative ions.

Correspondingly, the electric field may be maintained, thereby the alignment direction on the surface of the polymerizable material may be maintained, and the polymerizable material thin film may be polymerized to form a second thin film with an aligned surface so as to fix the alignment direction. The second thin film is a macromolecule thin film.

A method for preparing an organic thin film transistor according to the invention will be specifically illustrated below by taking the preparation process of a bottom gate-bottom contact OTFT as an example.

Figure 6:
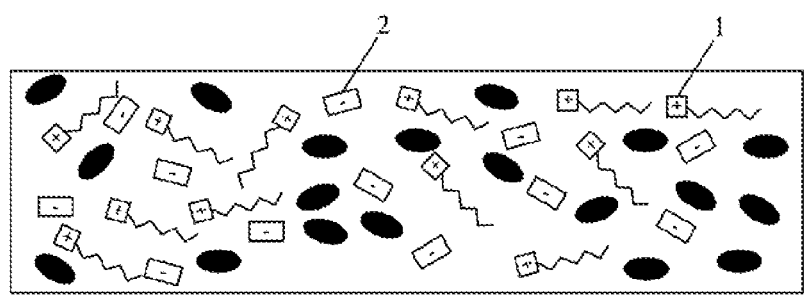
FIG. 6-FIG. 12 show schematic diagrams of the processes of preparing an organic thin film transistor according to one embodiment of the invention.

As shown in FIG. 6-FIG. 12, the preparation process of a bottom gate-bottom contact OTFT includes:

Step 200: preparing a homogeneous-phase mixed solution including the ion liquid and the polymerizable material, as shown in FIG. 6. The ion liquid is a liquid crystal phase ion liquid, which includes positive ions 1 and negative ions 2. The polymerizable material is a photosensitive resin. The ion liquid further has a fluorated radical, and an acting force between the fluorated radical and an air interface is larger than an acting force between the polymerizable material and an air interface.

Figure 7:
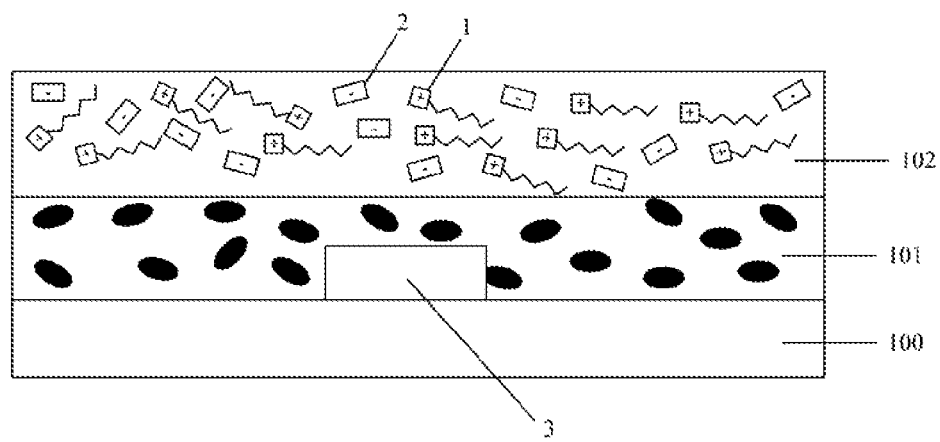

Step 201: forming a thin film of the mixed solution on the backing substrate 100 on which a gate electrode 3 is formed, and locating the ion liquid above the polymerizable material under the action of the fluorated radical, thereby forming the first thin film. The first thin film includes an ion liquid thin film 102 and a polymerizable material thin film 101 located under the ion liquid thin film 102, as shown in FIG. 7.

Further, the step of forming the gate electrode 3 includes:
providing a backing substrate 100, and forming a pattern of the gate electrode 3 consisting of a gate metal layer on the backing substrate 100, wherein the backing substrate 100 may be a glass substrate, a quartz substrate or an organic resin substrate;

Specifically, a gate metal layer with a thickness of 2500-16000 Å may be deposited on the backing substrate 100 via sputtering or heat evaporation. The gate metal layer may consist of a metal such as Cu, Al, Ag, Mo, Cr, Nd, Ni, Mn, Ti, Ta and W, etc. or an alloy of such metals. The gate metal layer may have a single-layer structure or a multi-layer structure, wherein the multi-layer structure is, for example, Cu\Mo, Ti\Cu\Ti and Mo\Al\Mo, etc. A layer of photoresist is coated on the gate metal layer, and the photoresist is exposed and developed via a mask plate so that a photoresist-removed region and a photoresist-reserved region are formed, wherein the photoresist-reserved region corresponds to the region in which the gate electrode 3 exists, and the photoresist-removed region corresponds to other regions. The gate metal thin film in the photoresist-removed region is totally etched via an etching process, and the remaining photoresist is peeled off to form a gate electrode 3.

After the gate electrode 3 is formed, a thin film of the homogeneous-phase mixed solution is formed on the backing substrate 100 via a film-forming process such as spin coating, printing or transfer printing, etc. The mixed solution includes an ion liquid, a polymerizable material and a film-forming agent. The ion liquid has a fluorated radical, the ion liquid is located above the polymerizable material under the action of the fluorated radical to form the first thin film. The first thin film includes an ion liquid thin film 102 and a polymerizable material thin film 101 located between the ion liquid thin film 102 and the gate electrode 3.

Figure 8:
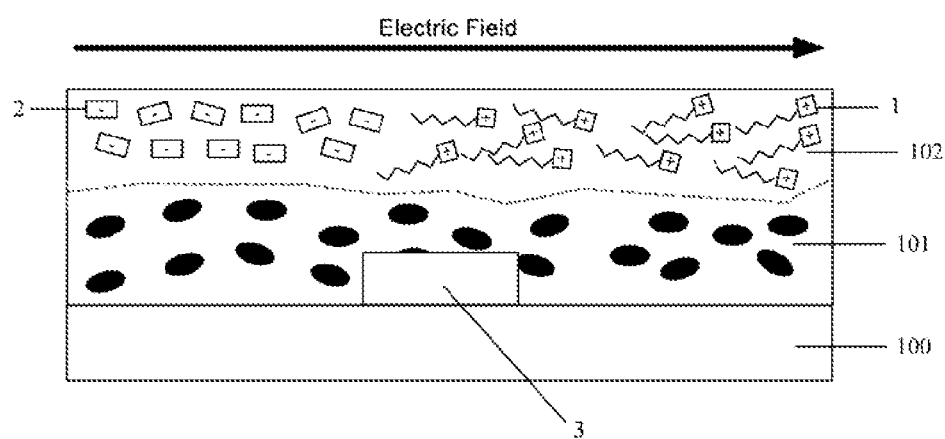

Step 202: applying an electric field in a direction, separating positive ions 1 and negative ions 2 in the ion liquid thin film 102, and aligning the surface of the polymerizable material thin film 101, as shown in FIG. 8, wherein the alignment direction is parallel to an extension direction of a connection line between a source electrode and a drain electrode.

Figure 9:
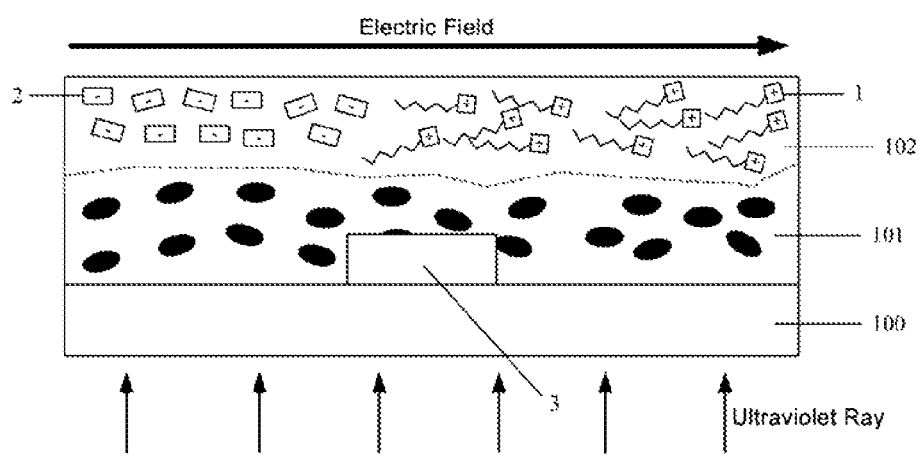
Figure 10:
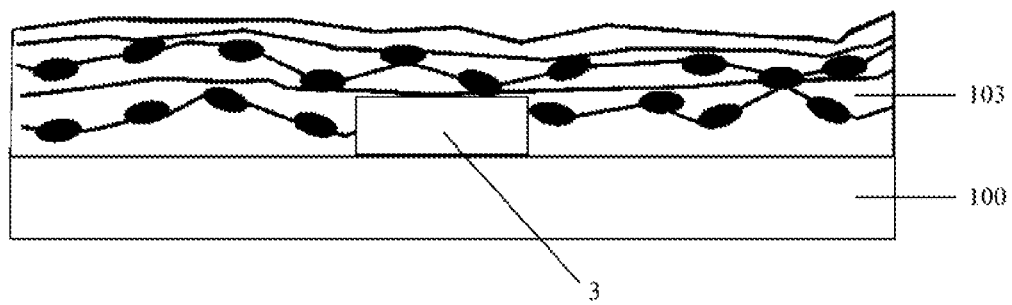

Step 203: maintaining the electric field, irradiating the polymerizable material thin film 101 via an ultraviolet ray, and polymerizing the polymerizable material to form a second thin film 103, as shown in FIG. 9 and FIG. 10, wherein the second thin film 103 is a macromolecule thin film.

Step 204: removing the ion liquid thin film 102 via a solvent, as shown in FIG. 9 and FIG. 10.

In Step 204, for some organic thin film used for an insulating function, if there exists remaining ion liquid, the insulating performance will be deteriorated.

In principle, after removing the solvent, the ion liquid washed down may be recycled.

Figure 11:
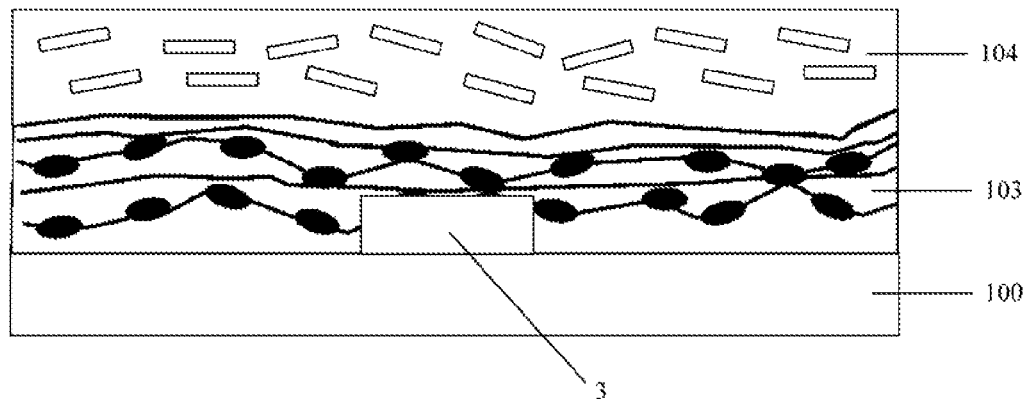
Figure 12:
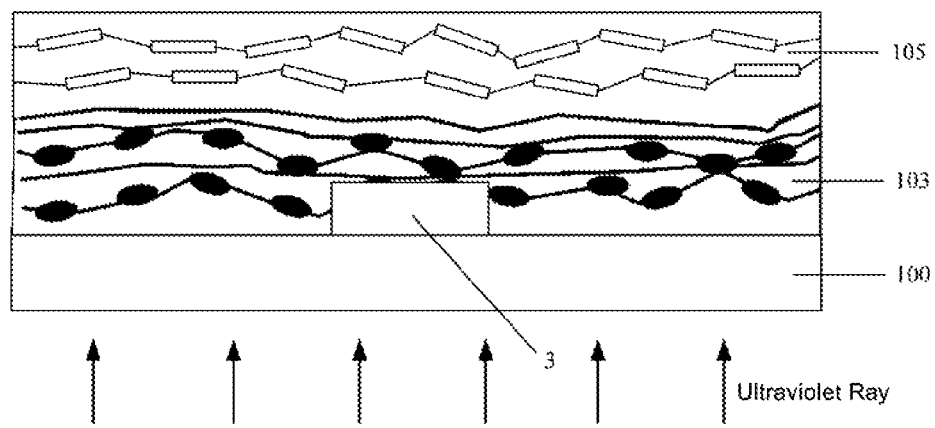

Step 205: forming a liquid crystal molecule thin film 104 on the second thin film 103, irradiating the liquid crystal molecule thin film 104 via an ultraviolet ray, and polymerizing the liquid crystal molecule thin film 104 to form an organic thin film 105, as shown in FIG. 11 and FIG. 12. The contact interface between the organic thin film 105 and the second thin film 103 has an alignment direction that matches the surface of the second thin film 103, thus an anisotropic organic thin film 105 is formed, wherein the organic thin film 105 is a liquid crystal macromolecule thin film.

The specific principle of this step is as follows: when formed on the second thin film 103 with an aligned surface, the liquid crystal molecules for preparing the organic thin film 105 will also be aligned, and the contact interface between the organic thin film 105 formed by polymerizing the liquid crystal molecules and the second thin film 103 has an alignment direction that matches the surface of the second thin film 103.

Step 206: forming a source electrode 4 and a drain electrode 5 on the organic thin film 105, as shown in FIG. 5.

Specifically, a source-drain metal layer with a thickness of about 2000-6000 Å may be deposited on the backing substrate 100, on which Step 205 has been performed, via magnetron sputtering, heat evaporation or other film-forming processes, wherein the source-drain metal layer may consist of a metal such as Cu, Al, Ag, Mo, Cr, Nd, Ni, Mn, Ti, Ta and W, etc. or an alloy of such metals. The source-drain metal layer may have a single-layer structure or a multi-layer structure, and the multi-layer structure may be, for example, Cu\Mo, Ti\Cu\Ti and Mo\Al\Mo, etc.

A layer of photoresist is coated on the source-drain metal layer, and the photoresist is exposed and developed via a mask plate to form a photoresist-removed region and a photoresist-reserved region, wherein the photoresist-reserved region corresponds to the region in which the source electrode 4 and the drain electrode 5 exist, and the photoresist-removed region corresponds to other regions; the source-drain metal thin film in the photoresist-removed region is totally etched via an etching process, and the remaining photoresist is peeled off to form a source electrode 4 and a drain electrode 5.

Step 207: forming a pattern of an organic semiconductor layer 6 on the organic thin film 105, the source electrode 4 and the drain electrode 5, as shown in FIG. 5.

Because of the induction action of the alignment of the insulating layer located under the organic semiconductor layer, the organic semiconductor layer 6 located on the organic thin film 105 has an identical alignment direction as the organic thin film 105, and the alignment direction is parallel to an extension direction of a connection line between the source electrode 4 and the drain electrode 5. In the working state of an OTFT, the carriers are transmitted from the source electrode 4 to the drain electrode 5 or from the drain electrode 5 to the source electrode 4. The alignment direction of the organic semiconductor layer 6 may improve the mobility of the carriers so as to upgrade the electrical features of the OTFT.

Specifically, an organic semiconductor layer with a thickness of about 300-1500 Å may be deposited on the backing substrate 100, on which Step 206 has been performed, via magnetron sputtering, heat evaporation or other film forming methods. The material of the organic semiconductor layer may be organic micromolecules such as pentacene and triphenyl amine, etc., or it may be organic macromolecules such as polyacetylenic or polyaromatic organic macromolecules, etc.

A layer of photoresist is coated on an organic semiconductor layer, and the photoresist is exposed and developed via a mask plate to form a photoresist-removed region and a photoresist-reserved region, wherein the photoresist-reserved region corresponds to the region in which a pattern of the organic semiconductor layer 6 exists, and the photoresist-removed region corresponds to other regions; the source-drain metal thin film in the photoresist-removed region is totally etched via an etching process, and the remaining photoresist is peeled off to form a pattern of an organic semiconductor layer 6. Since the organic thin film 105 has a fixed alignment direction, it guarantees that the pattern of an organic semiconductor layer 6 formed on the organic thin film 105 has a crystallization direction with a high degree of order, so that the performance of the OTFT may be improved.

By the above steps, an organic thin film transistor with good performance may be prepared.

Specifically, the anisotropy of the gate insulating layer prepared by the invention may be verified via optical dichroism (UV/IR/visible light), specifically as follows:

For the anisotropic insulating layer prepared by the invention, the ratio of UV absorption spectrum intensities of the gate insulating layer in the directions parallel to and vertical to its alignment direction is obtained by taking its UV absorption spectrum intensity as a quantization index, and the ratio is typically between 1.0-1.2, thus it has a good anisotropic characteristic.

For a bottom gate-bottom contact OTFT, in the working state, the carriers are concentrated in a width of a dozen or dozens of molecular layers where the gate insulating layer and the source-drain electrode contact. Thus, the performance of the organic thin film transistor will be directly affected by the quality of the anisotropic gate insulating layer. By applying the technical solutions of the invention to the preparation of a bottom gate-bottom contact OTFT, carrier mobility can be improved so that the working current of the organic thin film transistor can be increased by 1-2 orders of magnitude.

However, the above technical solutions are also applicable for other types of thin film transistors, for example, top gate-top contact thin film transistor, top gate-bottom contact thin film transistor and bottom gate-top contact thin film transistor, thus it may guarantee that an organic semiconductor layer formed on an insulating layer has a specific alignment direction (parallel to an extension direction of a connection line between a source electrode and a drain electrode), and carrier mobility may be improved so that the electrical properties of the thin film transistor may be upgraded. These all pertain to the protection scope of the invention.

According to an embodiment of the invention, there further provides an array substrate, which includes the above organic thin film transistor. For a display device employing such an array substrate, since the performance of the OTFT is improved, the display quality of the display device may be improved.

According to an embodiment of the invention, the organic thin film transistor is a bottom gate-bottom contact OTFT, thus a high-resolution display device can be realized.

In the technical solutions of the invention, the organic semiconductor layer of an organic thin film transistor is formed on an anisotropic insulating layer, this guarantees that the organic semiconductor layer has a crystallization direction with a high degree of order so that the performance of the organic thin film transistor is improved. Moreover, the process of preparing an anisotropic insulating layer has the advantages of simple process, large area and low cost, etc., and the thickness of the anisotropic insulating layer manufactured is small; since there exists no mechanical friction, there exists no badness caused by particles generated by friction.

The above description only shows some exemplary embodiments of the invention. It should be pointed that, for one of ordinary skills in the art, various improvements and substitutions may also be made without departing from the technical principles of the invention, and these improvements and substitutions should also be regarded as falling into the protection scope of the invention.

What is claimed is:

1. A method for preparing an organic thin film transistor, comprising forming an insulating layer; and forming a pattern of an organic semiconductor layer on the insulating layer, wherein the step of forming an insulating layer comprises:

forming a first thin film, which comprises an ion liquid thin film formed of an ion liquid and a polymerizable material thin film formed of a liquid polymerizable material, wherein the polymerizable material thin film is located under the ion liquid thin film;

separating positive and negative ions in the ion liquid thin film, and aligning a surface of the polymerizable material thin film;

keeping separation of the positive and the negative ions, and polymerizing the polymerizable material thin film to form a second thin film with an aligned surface;

removing the ion liquid thin film; and forming a liquid crystal molecule thin film on the second thin film, and polymerizing the liquid crystal molecule thin film to form an organic thin film, wherein an interface where the organic thin film contacts the second thin film is aligned in such a manner as to match the aligned surface of the second thin film, so as to form an anisotropic organic thin film.

2. The preparation method according to claim 1, wherein the organic semiconductor layer and the organic thin film have an identical alignment direction.

3. The preparation method according to claim 2, wherein the alignment direction is parallel to an extension direction of a connection line between a source electrode and a drain electrode.

4. The preparation method according to claim 1, wherein the ion liquid comprises a side-chain radical, and an acting force between the side-chain radical and an air interface is larger than an acting force between the polymerizable material and the air interface.

5. The preparation method according to claim 4, wherein the step of forming the first thin film comprises:

preparing a homogeneous-phase mixed solution comprising the ion liquid and the polymerizable material; and forming a thin film consisting of the mixed solution under an air environment, wherein the ion liquid is located above the polymerizable material under the action of the side-chain radical.

6. The preparation method according to claim, wherein the side-chain radical is a fluorated radical.

7. The preparation method according to claim 1, wherein the ion liquid is a liquid crystal phase ion liquid.

8. The preparation method according to claim 1, wherein the positive and the negative ions in the ion liquid thin film are separated by applying an electric field.

9. The preparation method according to claim 7, wherein the positive and the negative ions in the ion liquid thin film are separated by applying an electric field.

10. The preparation method according to claim 1, wherein the polymerizable material is a photopolymerizable material.

11. The preparation method according to claim 1, wherein the method further comprises:

forming a gate electrode of the organic thin film transistor before forming the insulating layer;

forming a source electrode and a drain electrode on the insulating layer before the step of forming the pattern of the organic semiconductor layer on the insulating layer; and forming the pattern of the organic semiconductor layer pattern on the insulating layer, the source electrode and the drain electrode.

12. The preparation method according to claim 5, wherein the side-chain radical is a fluorated radical.

13. The preparation method according to claim 2, wherein the ion liquid is a liquid crystal phase ion liquid.

14. The preparation method according to claim 3, wherein the ion liquid is a liquid crystal phase ion liquid.

* * * * *